(12) United States Patent  
Han et al.

(10) Patent No.: US 7,518,539 B2  
(45) Date of Patent: Apr. 14, 2009

(54) CONCURRENT CORRELATED DOUBLE SAMPLING AND ANALOG-TO-DIGITAL CONVERSION

(75) Inventors: June-Soo Han, Seoul (KR); Kyu-Hyoun Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/805,135

(22) Filed: May 22, 2007

(65) Prior Publication Data

US 2008/0055143 A1    Mar. 6, 2008

(30) Foreign Application Priority Data

Sep. 5, 2006    (KR) .................. 10-2006-0084910

(51) Int. Cl.  
*H03M 1/12*    (2006.01)
(52) U.S. Cl. .................. 341/155; 341/122; 341/172; 348/222.1; 348/241; 348/308
(58) Field of Classification Search ................. 341/122, 341/155  
See application file for complete search history.

(56) References Cited

U.S. PATENT DOCUMENTS

| | | | |
|---|---|---|---|
| 6,727,486 B2 * | 4/2004 | Choi | 250/208.1 |
| 7,227,488 B2 * | 6/2007 | Cho | 341/155 |
| 7,227,570 B2 * | 6/2007 | Sato et al. | 348/222.1 |
| 7,236,117 B1 * | 6/2007 | Varma et al. | 341/155 |
| 7,265,706 B2 * | 9/2007 | Boemler | 341/163 |
| 2002/0122129 A1 * | 9/2002 | Lee | 348/308 |

OTHER PUBLICATIONS

Korean Patent Application No. 1020000086594 to Lee, having Publication date of Jul. 12, 2002 (w/ English Abstract page).  
Korean Patent Application No. 1020020017316 to Choi, having Publication date of Oct. 8, 2003 (w/ English Abstract page).  
Japanese Patent Application No. 2000-235630 to Yoshitomo et al., having Publication date of Feb. 15, 2002 (w/ English Abstract page).  
Japanese Patent Application No. 2002-364131 to Yasuhiro, having Publication date of Jul. 15, 2004 (w/ English Abstract page).

* cited by examiner

*Primary Examiner*—Khai M Nguyen  
(74) *Attorney, Agent, or Firm*—Monica H. Choi

(57) ABSTRACT

For signal processing such as in an image sensor, a CDS (correlated double sampling) unit generates a first CDS signal from a first set of input signals at a predetermined node. In addition, a conversion unit converts a second CDS signal into a respective converted signal concurrently as the CDS unit generates the fist CDS signal. The second CDS signal is determined from a second set of input signals previously generated at the predetermined node.

20 Claims, 13 Drawing Sheets

PERFORMING CDS OF N-TH LINE AND ADC OF (N-1)-TH LINE IN PARALLEL

PERFORMING CDS OF N-TH LINE AND ADC OF (N-1)-TH LINE IN PARALLEL

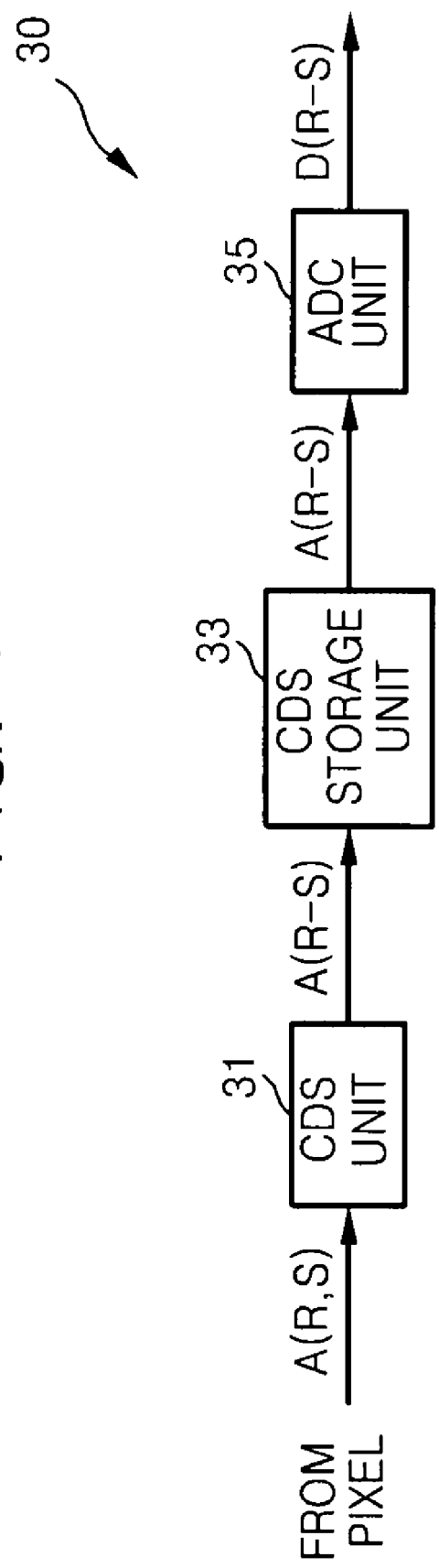

CONCURRENT CORRELATED DOUBLE SAMPLING AND ANALOG-TO-DIGITAL CONVERSION

BACKGROUND OF THE INVENTION

This application claims priority under 35 USC §119 to Korean Patent Application No. 2006-84910, filed on Sep. 5, 2006 in the Korean Intellectual Property Office, the disclosure of which is incorporated herein in its entirety by reference.

1. Field of the Invention

The present invention relates generally to correlated double sampling (CDS) and analog-to-digital conversion (ADC), and more particularly to concurrent CDS and ADC such as in an image sensor for increased frequency performance.

2. Background of the Invention

Correlated double sampling (CDS) is widely used to detect only a desired signal component in a device such as an image sensor by removing, for example, fixed pattern noise (FPN), from a signal output from a unit pixel. For CDS, a difference between a reset signal and an image signal is determined. The reset signal is generated with a predetermined voltage level applied on the unit pixel. The image signal represents an intensity of light sensed by the unit pixel. Thus, CDS is effective in reducing FPN that is inherent in the unit pixels and also noise caused by characteristic differences between the unit pixels.

FIG. 1 is a block diagram of a conventional unit block 1 in a conventional CMOS (complementary metal oxide semiconductor) image sensor, for performing CDS and analog-to-digital conversion (ADC) sequentially in series. Referring to FIG. 1, the unit block 1 includes a pixel 10 and a unit CDS block 13. For clarity of description, an image signal processor (ISP) 19 is illustrated together with the unit block 1. A pixel array of the CMOS image sensor includes a plurality of pixels and a CDS array having a plurality of unit CDS blocks, each having similar components to the unit CDS block 13.

The pixel 10 includes a sensor (e.g., a photodiode) for detecting an intensity of light by photoelectric conversion and a photoelectric converter (e.g., four transistors) for outputting an electrical image signal A(S) from such photoelectric conversion and a reset signal A(R) from an applied reset voltage, both as analog signals.

The unit CDS block 13 includes a CDS circuit 15 for generating a difference A(R-S) between the reset signal A(R) and the image signal A(S) from the pixel 10 using CDS. In addition, the unit CDS block 13 includes an ADC unit 17 for converting the difference signal A(R-S) that is an analog signal from the CDS circuit 15 into a digital signal D(R-S). The ISP 19 performs diverse signal processing operations on the digital signal D(R-S) from the ADC unit 17.

The unit CDS block 13 performs CDS and ADC successively with continuously performing the ADC after performing the CDS or with performing the ADC a predetermined period of time after performing the CDS. Here, it is assumed that the unit CDS block 13 continuously performs the CDS and the ADC in succession.

FIG. 2 is a timing diagram of signals when the unit CDS block 13 of FIG. 1 performs CDS and ADC. Referring to FIG. 2, analog reset and images signals are sampled and output from the pixel 10 in units of each line (i.e. row) in a sequential scanning manner as a respective unit CDS block 13 is coupled to each column of pixels. In FIG. 2, a scan time "1H Time" indicates the time allowed for completing CDS and ADC with respect to a single line (i.e., row).

During time $T_{CDS}$ when the CDS is performed, reset signal sampling and image signal sampling are sequentially performed. Such a time $T_{CDS}$ determines operating speed and other characteristics of the CMOS image sensor. Thus, the time $T_{CDS}$ should be maintained independently and absolutely. Time $T_{ADC}$ during which the ADC is performed may be more flexibly maintained than the time $T_{CDS}$. However, the time $T_{ADC}$ also determines the operating frequency and limits a frame rate of the CMOS image sensor.

SUMMARY OF THE INVENTION

Accordingly, correlated double sampling and analog to digital conversion are performed concurrently for enhanced speed performance of a device such as an image sensor.

For signal processing according to an aspect of the present invention, a CDS (correlated double sampling) unit generates a first CDS signal from a first set of input signals generated at a predetermined node. In addition, a conversion unit converts a second CDS signal into a respective converted signal concurrently as the CDS unit generates the fist CDS signal. The second CDS signal has been determined from a second set of input signals generated at the predetermined node.

In another embodiment of the present invention, a CDS storage unit stores the second CDS signal that was generated by the CDS unit before the CDS unit generates the first CDS signal. Furthermore, a transmission control unit includes switches for transmitting the second CDS signal from the CDS storage unit to the conversion unit concurrently as the CDS unit generates the first CDS signal. The transmission control unit also transmits the second CDS signal from the CDS storage unit to the conversion unit concurrently as the first CDS signal is stored into the CDS storage unit.

In a further embodiment of the present invention, a comparing and digitizing unit receives an analog CDS signal from the transmission control unit for digitizing a result of comparing a reference signal with the analog CDS signal. The reference signal is one of a ramp signal or a DC (direct current) signal in an example embodiment of the present invention.

In another example embodiment of the present invention, the CDS storage unit includes a first capacitor for storing the first CDS signal and includes a second capacitor for storing the second CDS signal.

In a further embodiment of the present invention, the CDS unit includes a capacitor and first and second switches. The capacitor has a first node coupled to the predetermined node. The first switch is coupled between a second node of the capacitor and a ground node, and the second switch is coupled between the second node of the capacitor and an output node of the CDS unit. The first and second switches are controlled to generate the first CDS signal from the first set of input signals generated successively at the predetermined node and to generate the second CDS signal from the second set of input signals generated successively at the predetermined node.

The present invention may be used to particular advantage when the predetermined node is coupled to a plurality of pixels of an image sensor. In that case, the first CDS signal is for a first pixel of such pixels, and the second CDS signal is for a second pixel of such pixels. For example, the first and second pixels are adjacently disposed along a same column of pixels in the pixel array.

In this manner, because the CDS and ADC are performed concurrently with time overlap, the total time for performing the CDS and ADC is minimized for enhanced speed performance of the image sensor or any other device using CDS and ADC.

BRIEF DESCRIPTION OF THE DRAWINGS

The above and other features and advantages of the present invention will become more apparent when described in detailed exemplary embodiments thereof with reference to the attached drawings in which:

FIG. 4 is a block diagram of an example unit CDS block of FIGS. 3A and 3B for performing CDS and ADC concurrently, according to an embodiment of the present invention;

The figures referred to herein are drawn for clarity of illustration and are not necessarily drawn to scale. Elements having the same reference number in FIGS. 1, 2, 3A, 3B, 4, 5, 6A, 6B, 6C, 6D, 7, 8, and 9 refer to elements having similar structure and/or function.

DETAILED DESCRIPTION OF THE INVENTION

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 3A:
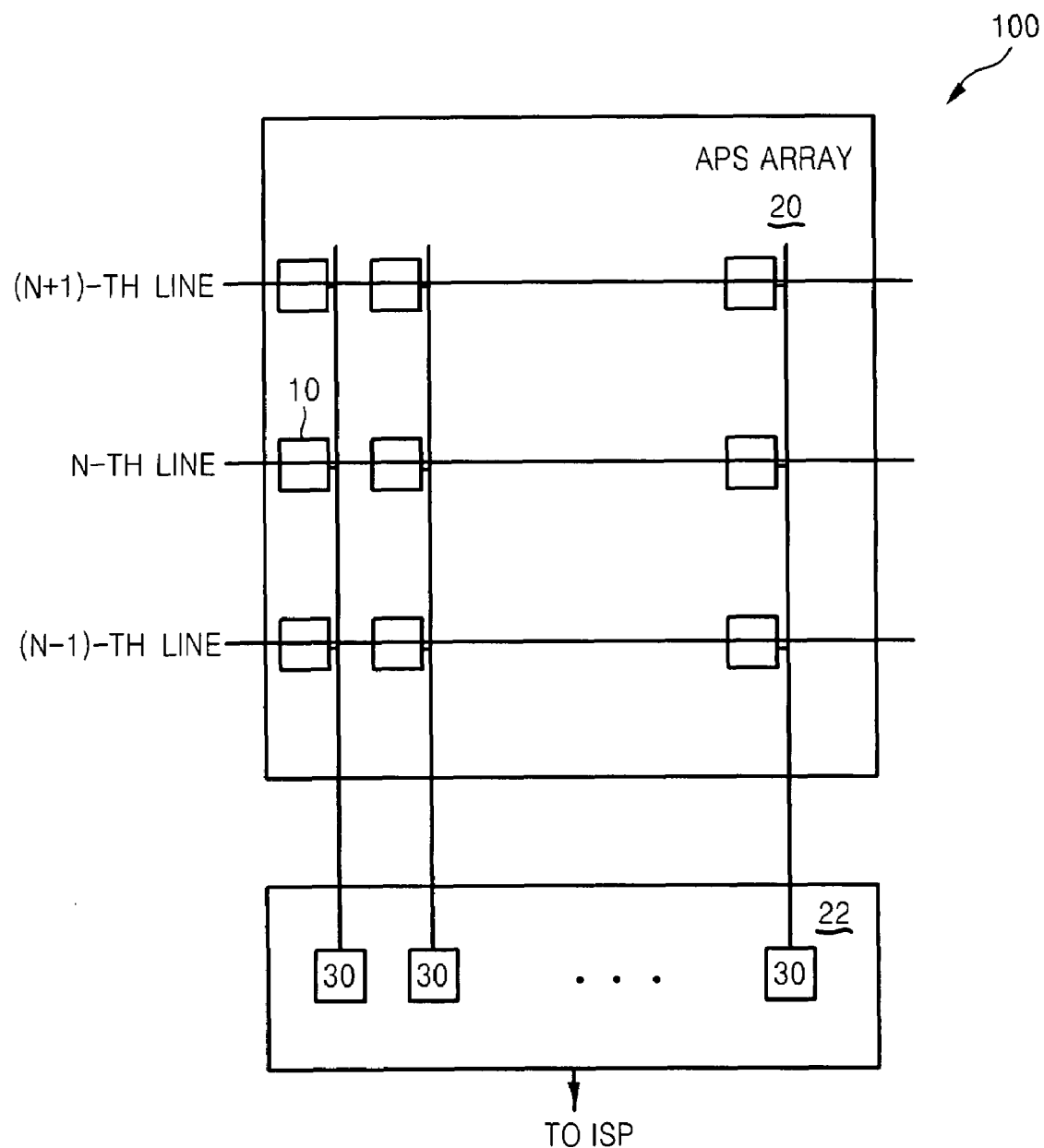
FIG. 3A shows a block diagram of an image sensor having unit CDS blocks for performing CDS and ADC concurrently, according to an embodiment of the present invention.

FIG. 3A shows a block diagram of an image sensor 100 such as a CMOS (complementary metal oxide semiconductor) image sensor having CDS (correlated double sampling) and ADC (analog to digital conversion) performed concurrently according to an embodiment of the present invention. The image sensor 100 includes an active pixel sensor (APS) array 20 including a plurality of pixels 10 and a CDS array 22 including a plurality of unit CDS blocks 30.

Each unit CDS pixel block 30 is connected to a respective column of pixels in the pixel array 20. For example, each unit CDS pixel block 30 is coupled to a predetermined node formed by a metal connect coupled across such a respective column of pixels. In an example embodiment of the present invention, the CDS array 22 uses single-slope ADC units so that ADC is performed simultaneously for all columns at each row (i.e., line in FIG. 3A). In this case, the number of the unit CDS blocks 30 in the CDS array 22 is the same as the number of columns of pixels in the pixel array 20.

Figure 1:
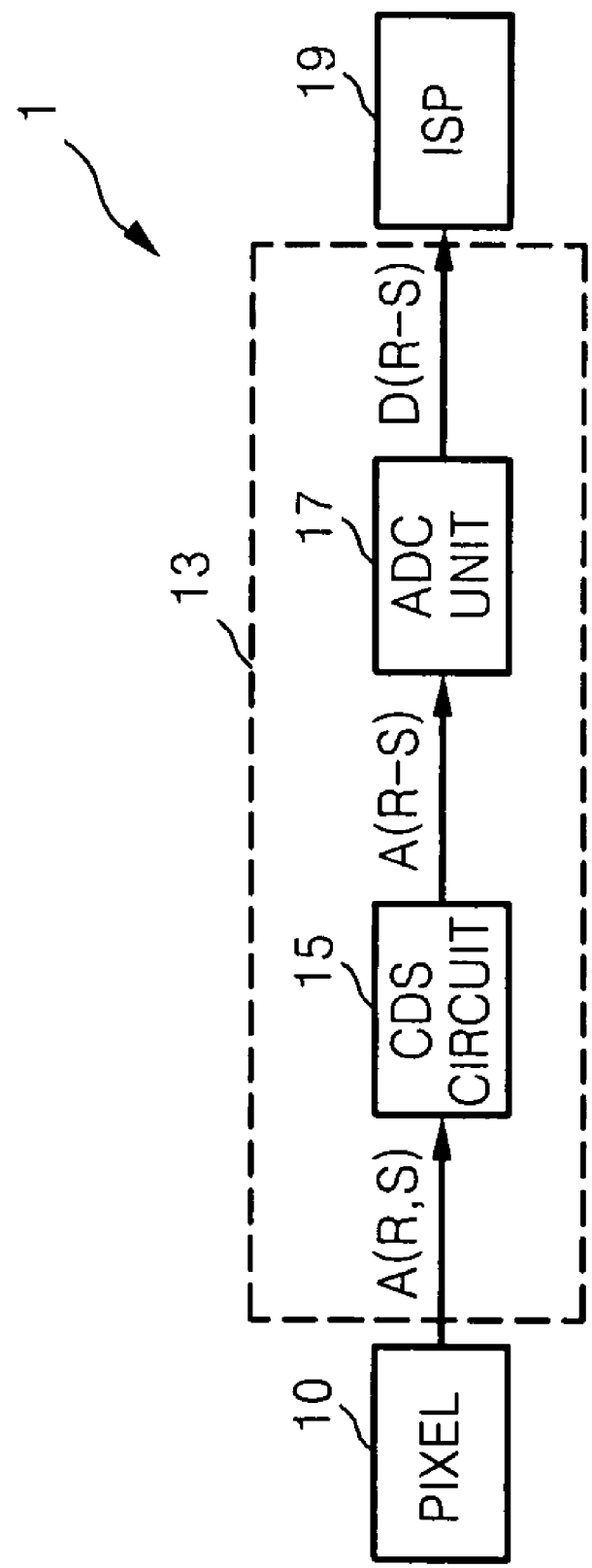
FIG. 1 is a block diagram of a unit block in a conventional CMOS image sensor for performing correlated double sampling (CDS) and analog-to-digital conversion (ADC) successively.
Figure 2:
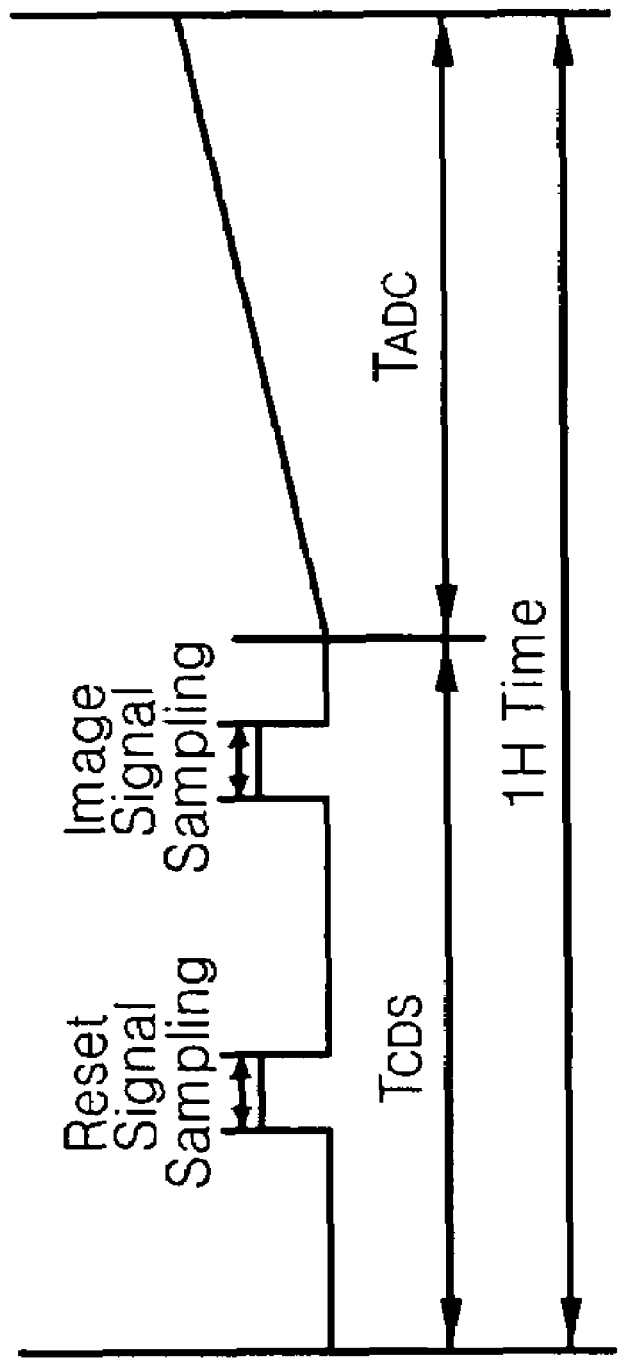
FIG. 2 is a timing diagram of signals during operation of a unit CDS block in FIG. 1 for performing CDS and ADC successively according to the prior art.
Figure 3B:
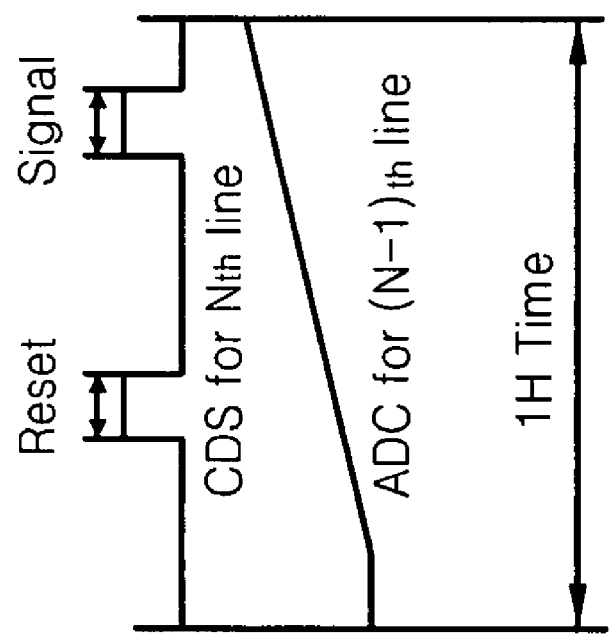
FIG. 3B shows a timing diagram during operation of a unit CDS block for performing CDS and ADC concurrently, according to an embodiment of the present invention.

FIGS. 3B shows a timing diagram during operation of a unit CDS pixel block 30 with concurrent CDS and ADC in parallel, according to an embodiment of the present invention. FIG. 3B is contrasted with the prior art timing diagram of FIG. 2 that performs CDS and ADC successively in series. In FIG. 3B, the unit CDS block 30 performs CDS for a first pixel coupled to an N-th line concurrently with performing ADC for a second pixel coupled to an (N−1)-th line (i.e., a previous row from the N-th line). Accordingly, the scan time "1H Time" of the unit CDS block 30 in FIG. 3B is greatly reduced from the prior art scan time "1H Time" in FIG. 2.

FIG. 4 is a block diagram of an example unit CDS block 30 that performs CDS and ADC concurrently in parallel according to an embodiment of the present invention. Referring to FIG. 4, the unit CDS block 30 includes a CDS (correlated double sampling) unit 31, a CDS (correlated double sampling) storage unit 33, and an ADC (analog to digital conversion) unit 35.

The CDS unit 31 receives a reset signal A(R) and an image signal A(S) that are output sequentially on the predetermined node coupled to the column of pixels and the unit CDS block 30. The reset signal A(R) and the image signal A(S) are analog signals, and the CDS unit 31 outputs a difference between such signals A(R) and A(S) as an analog CDS signal A(R-S).

The CDS storage unit 33 includes a plurality of storage units and stores the analog CDS signal A(R-S) output from the CDS unit 31 in one of the plurality of storage units. The ADC unit 35 receives the analog CDS signal A(R-S) from the CDS storage unit 33 and performs ADC on the received analog CDS signal A(R-S) to output a digital signal D(R-S). The digital signal D(R-S) may be output to an image signal processor (not shown).

A respective set of reset and image analog signals A(R, S) are sequentially output from a respective pixel on the predetermined node coupled to the example unit CDS block 30 such as during the scan time "1H Time" in FIG. 3B. Such sets of reset and image analog signals A(R, S) are continuously output on such a predetermined node during successive scan times for processing an image frame for example.

Figure 5:
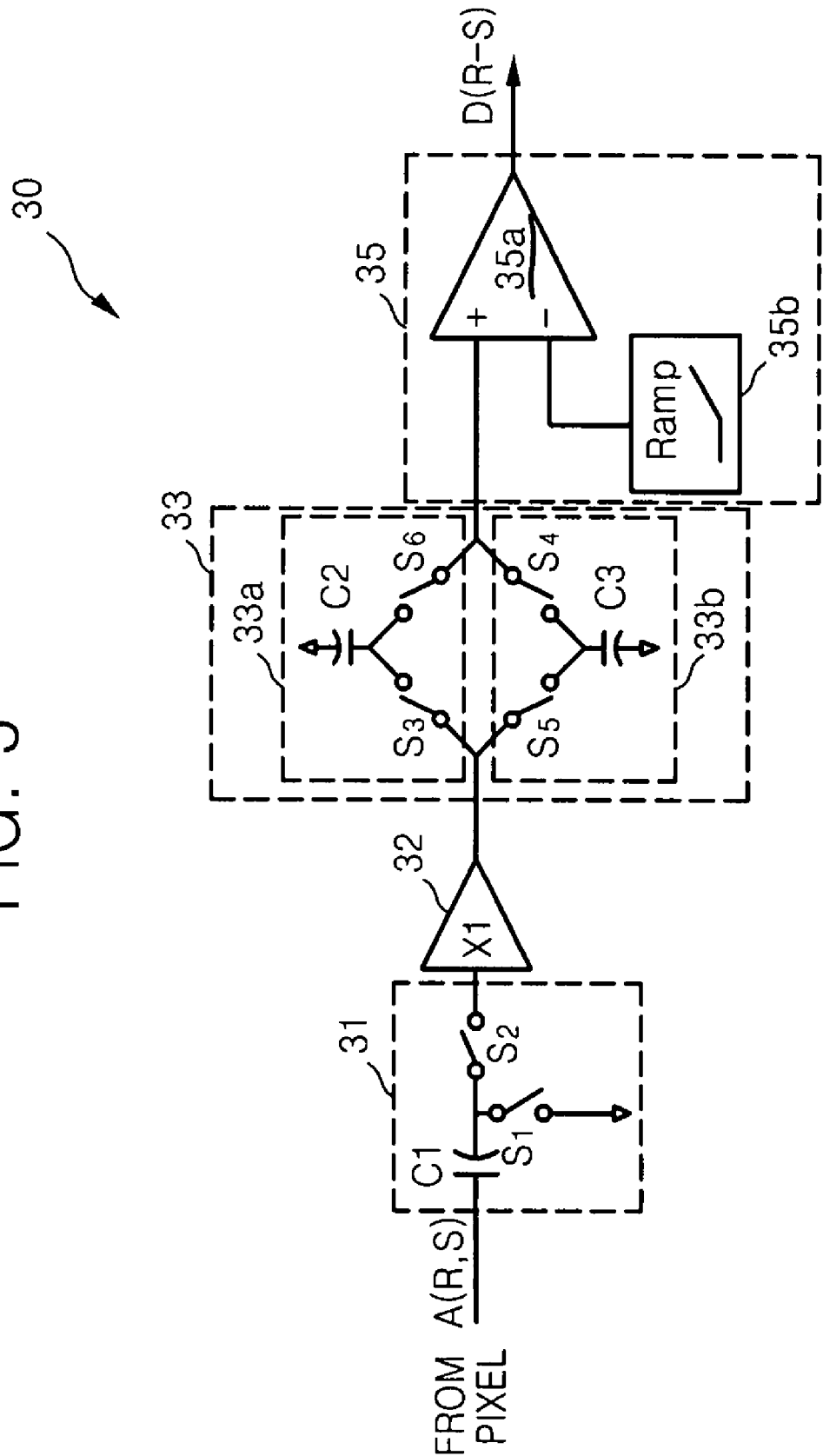
FIG. 5 is a circuit diagram of the unit CDS block of FIG. 4, according to an embodiment of the present invention.

FIG. 5 is a circuit diagram of the example unit CDS block 30 of FIG. 4 according to an embodiment of the present invention. The unit CDS block 30 of FIG. 5 further includes a buffer 32 for buffering the analog CDS signal A(R-S) output from the CDS unit 31. However, the present invention may be practiced with or without the buffer 32.

Referring to FIG. 5, the CDS unit 31 sequentially samples a reset signal A(R) and an image signal A(S) output from a pixel using CDS. To that end, the CDS unit 31 includes a sampling capacitor C1, a first switch S1, and a second switch S2. The sampling capacitor C1 has a first terminal connected to the predetermined node connecting the column of pixels and the example unit CDS block 30. The first switch S1 is connected between a second terminal of the sampling capacitor C1 and a ground node.

The present invention may also be practiced in another embodiment of the present invention with the first switch S1 being connected between the second terminal of the sampling capacitor C1 and a reference source providing a reference signal which may be a ramp signal.

Referring back to the embodiment of FIG. 5, the reset signal A(R) from a pixel is generated at the first terminal of the sampling capacitor C1 as the first switch S1 is closed and the second switch S2 is opened. Thus, the reset signal A(R) is stored as a voltage in the sampling capacitor C1. Thereafter, the image signal A(S) from the pixel is generated at the first terminal of the sampling capacitor C1 as the first switch S1 is opened and the second switch S2 is closed. Thus, the image signal A(S) is sampled by the sampling capacitor C1 with the analog CDS signal A(R-S) corresponding to a difference of the reset and image signals A(R) and A(S) being output by the CDS unit 31 to the buffer 32.

The buffer 32 buffers the analog CDS signal A(R-S) to the CDS storage unit 33. The CDS storage unit 33 includes a plurality of storage units including a first storage unit 33a and a second storage unit 33b in FIG. 5. The first storage unit 33a includes a first storage capacitor C2, and the second storage unit 33b includes a second storage capacitor C3.

A third switch S3 within the first storage unit 33a is connected between the output of the buffer 32 and the first storage capacitor C2. A fourth switch S4 within the second storage unit 33b is connected between an input to the ADC unit 35 and the second storage capacitor C3.

A fifth switch S5 within the second storage unit 33b is connected between the output of the buffer 32 and the second storage capacitor C3. A sixth switch S6 within the first storage unit 33a is connected between the input to the ADC unit 35 and the first storage capacitor C2.

Figure 8:
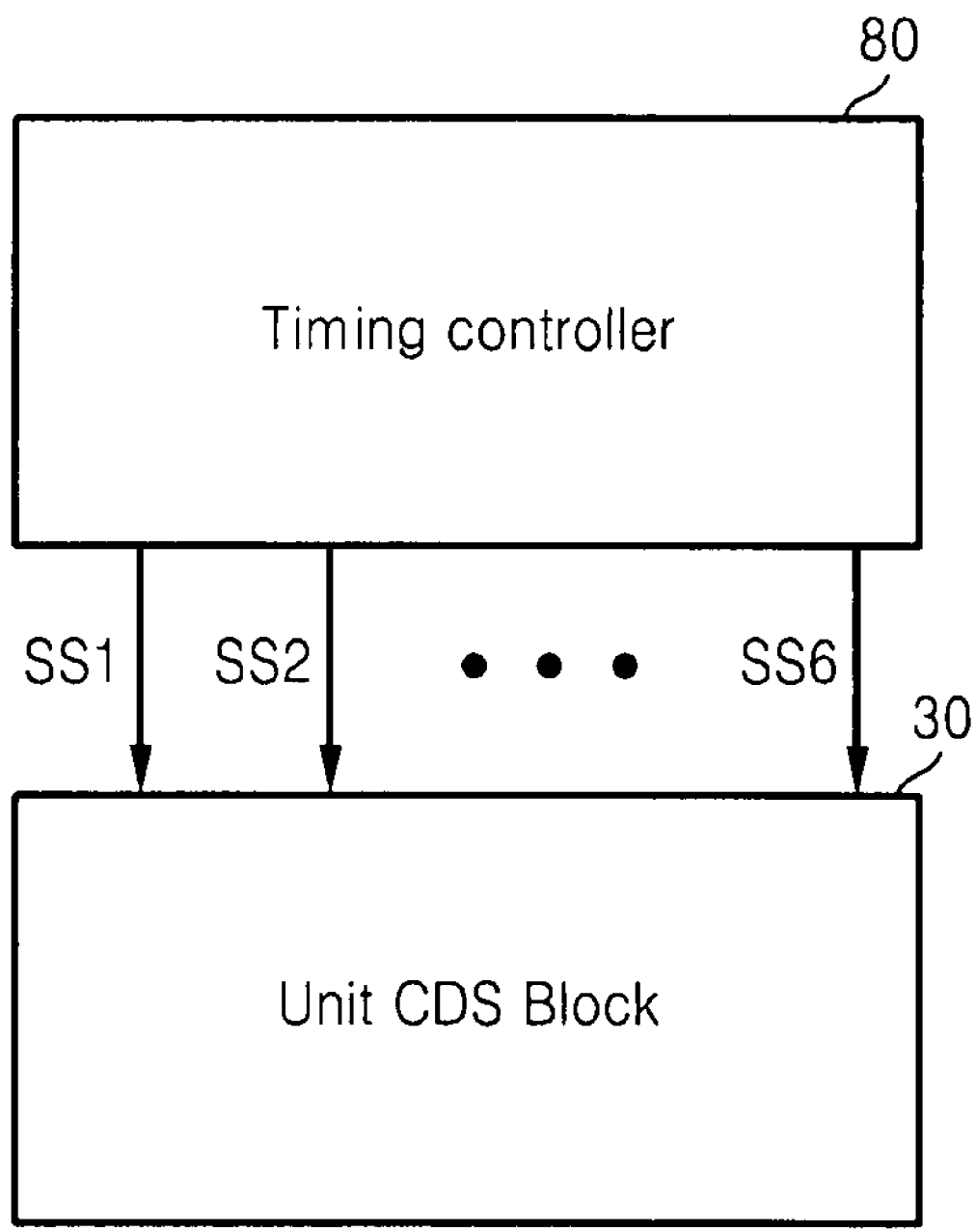
FIG. 8 shows a timing controller as an additional component in the image sensor of FIG. 3A for generating control signals for controlling the switches in FIG. 5, according to an embodiment of the present invention.

For clarity of the description, only two storage units 33a and 33b are illustrated in FIG. 5, but the present invention may be practiced with the CDS storage unit 33 including more than two storage units. FIG. 8 shows an example timing controller 80 of the CMOS image sensor 100 for generating control signals SS1, SS2, SS3, SS4, SS5, and SS6 for controlling the switches S1, S2, S3, S4, S5, and S6, respectively, of FIG. 5.

Referring back to FIG. 5, the ADC unit 35 includes a comparing and digitizing unit 35a and a reference signal generator 35b which generates a reference signal that is a ramp signal in one embodiment of the present invention. The present invention may also be practiced with the reference signal generator 35b generating a DC (direct current) reference signal.

In any case, the comparing and digitizing unit 35a includes a comparator with a positive terminal that receives an analog CDS signal from the CDS storage unit 33 and with a negative terminal that receives the reference signal from the reference signal generator 35b. Such a comparator compares such an analog CDS signal and such a reference signal, and a digital signal is generated from the result of such a comparison.

For example, as the ramp signal from the reference signal generator 35b begins to ramp up from an initial time point, the output of the comparator is activated at an activating time point when the level of the ramp signal becomes greater than the analog CDS signal. In that case, the comparing and digitizing unit 35a also includes a counter for counting from such an initial time point to such an activating time point to output a digital count signal D(R-S) as a respective converted signal of the analog CDS signal. The digital signal D(R-S) from the ADC unit 35 may be provided to an image signal processor (not shown).

When the CMOS image sensor 100 converts an analog signal into a digital signal using column-parallel ADC, a respective unit CDS block 30 of FIG. 4 or 5 is disposed at each column. In addition, the ADC may be performed simultaneously with respect to all of the columns in a row.

Figure 6A:
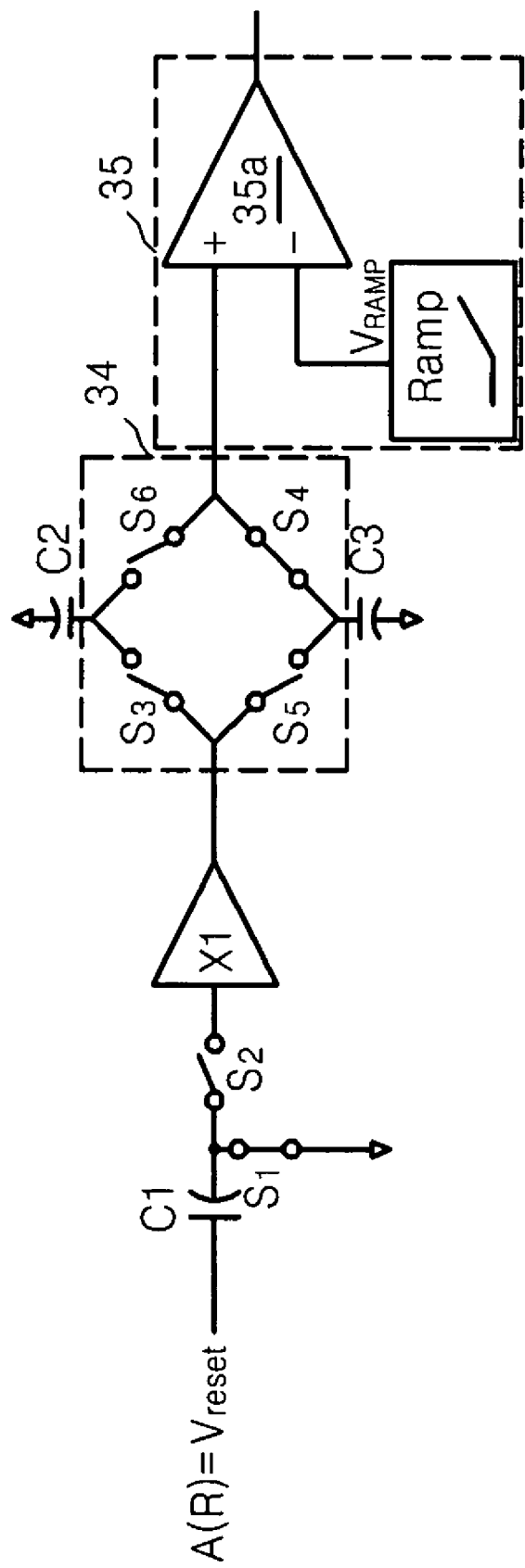
FIGS. 6A, 6B, 6C, and 6D illustrate the configuration of switches in FIG. 5 for performing CDS and ADC concurrently for multiple lines of the image sensor, according to an embodiment of the present invention.
Figure 6B:
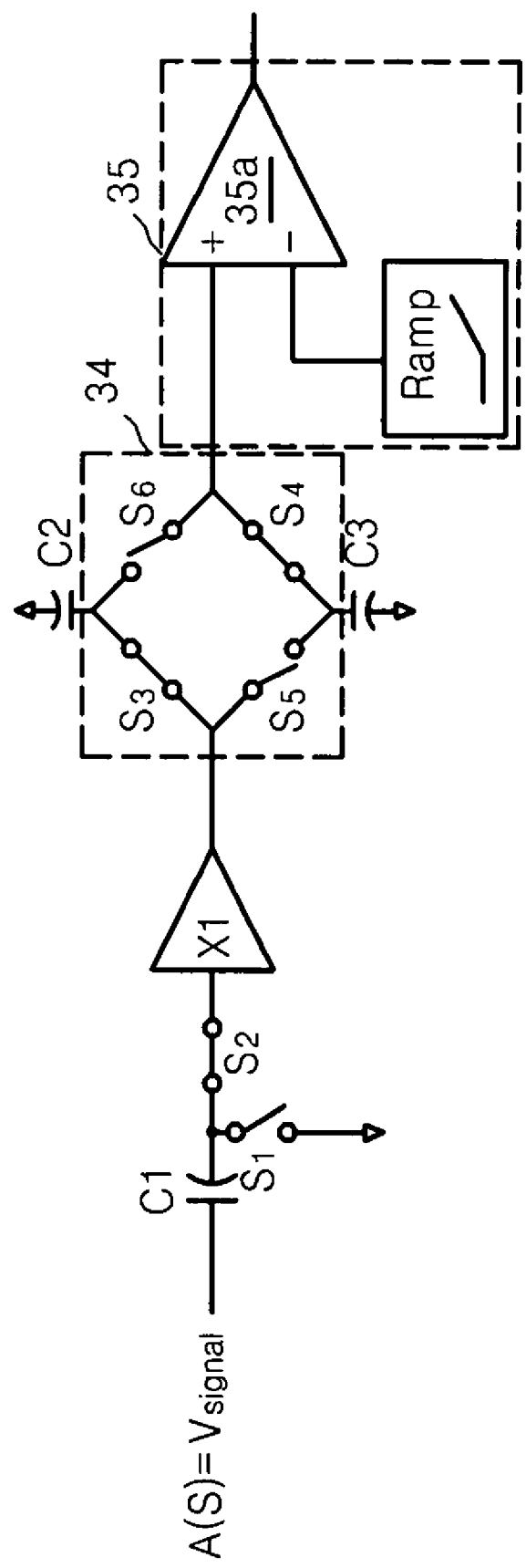
Figure 6C:
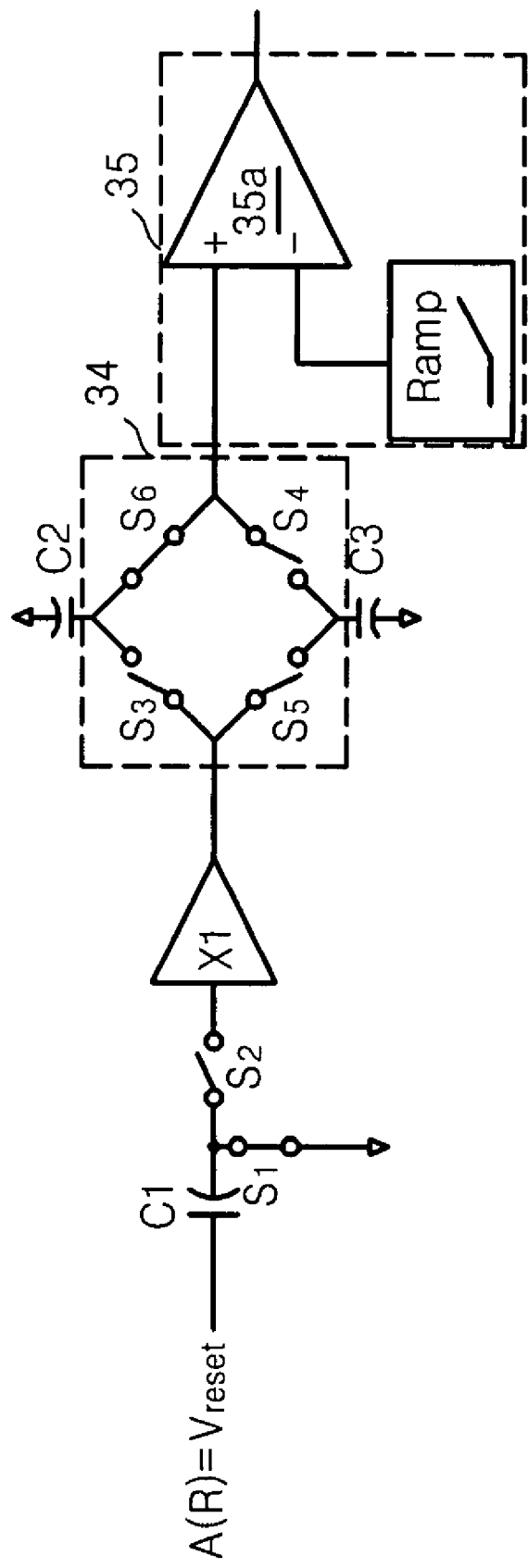
Figure 6D:
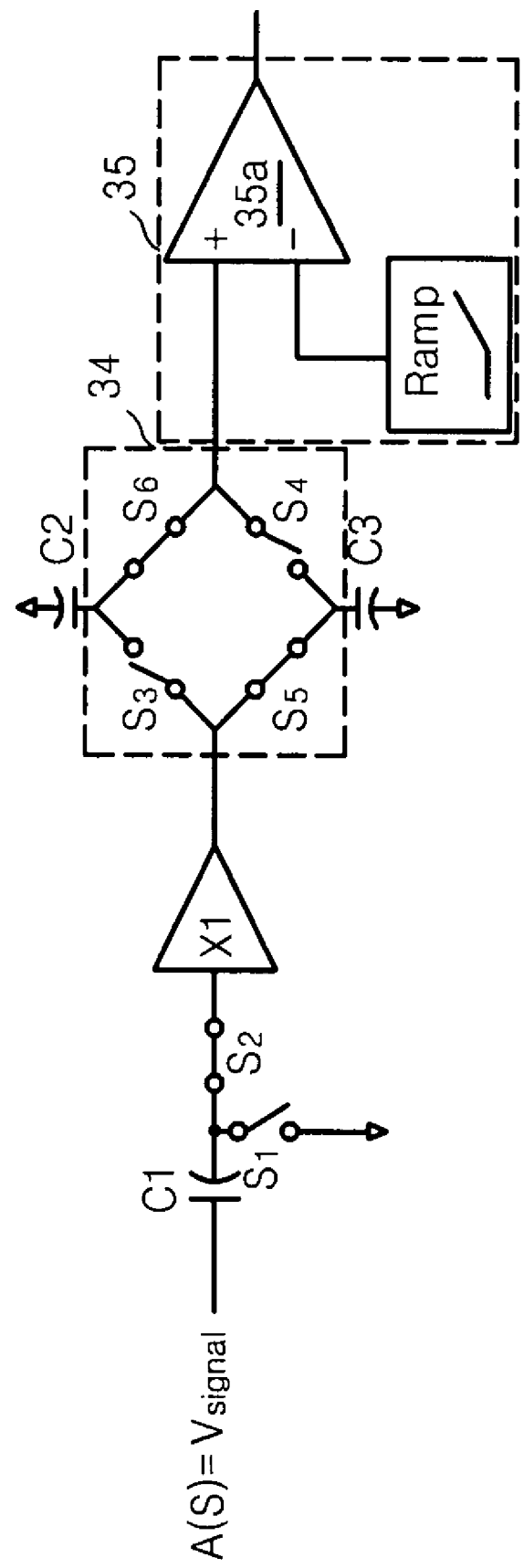
Figure 7:
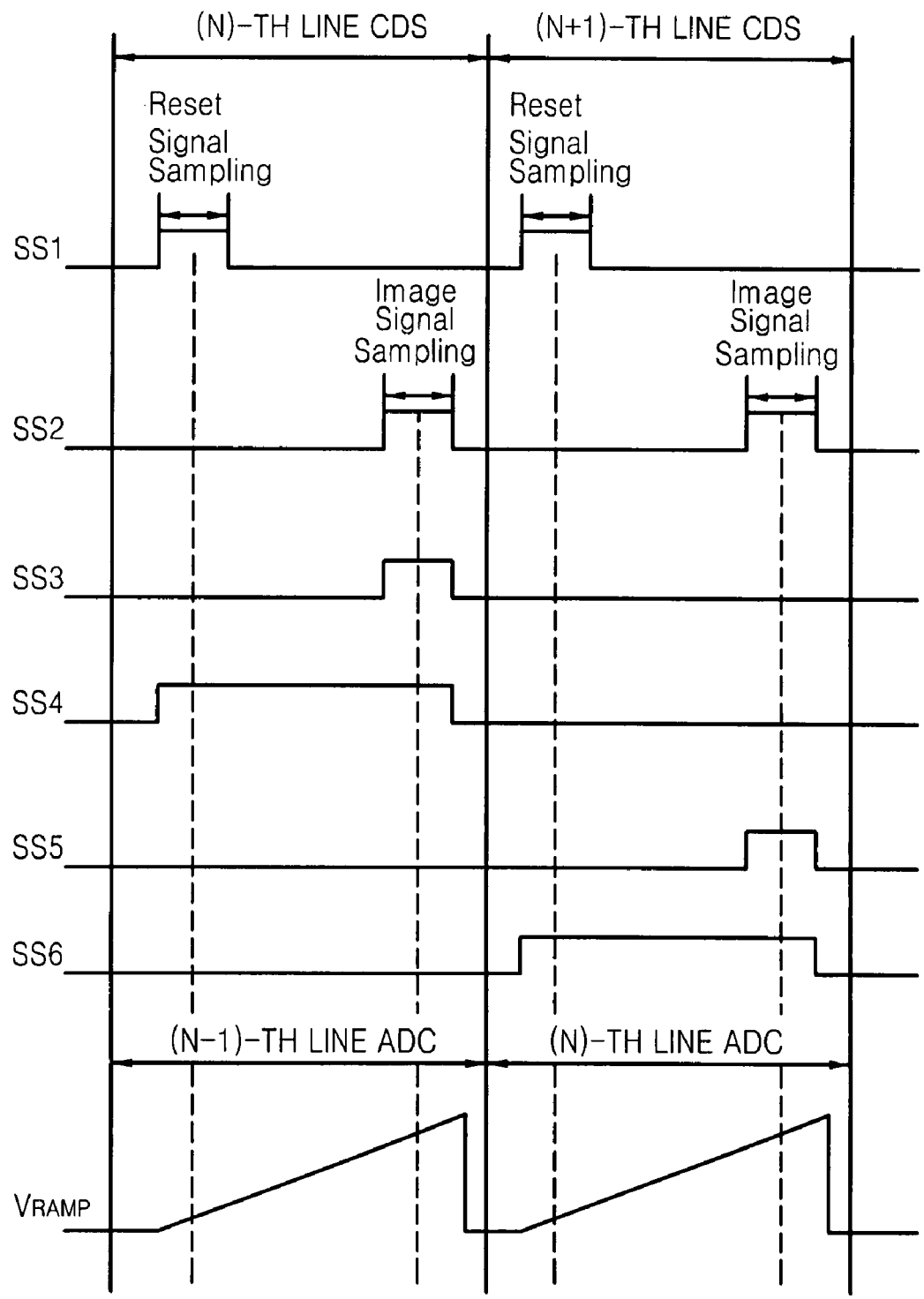
FIG. 7 is a timing diagram of signals during operation of the unit CDS block of FIG. 5 according to FIGS. 6A, 6B, 6C, and 6D, according to an embodiment of the present invention.
Figure 9:
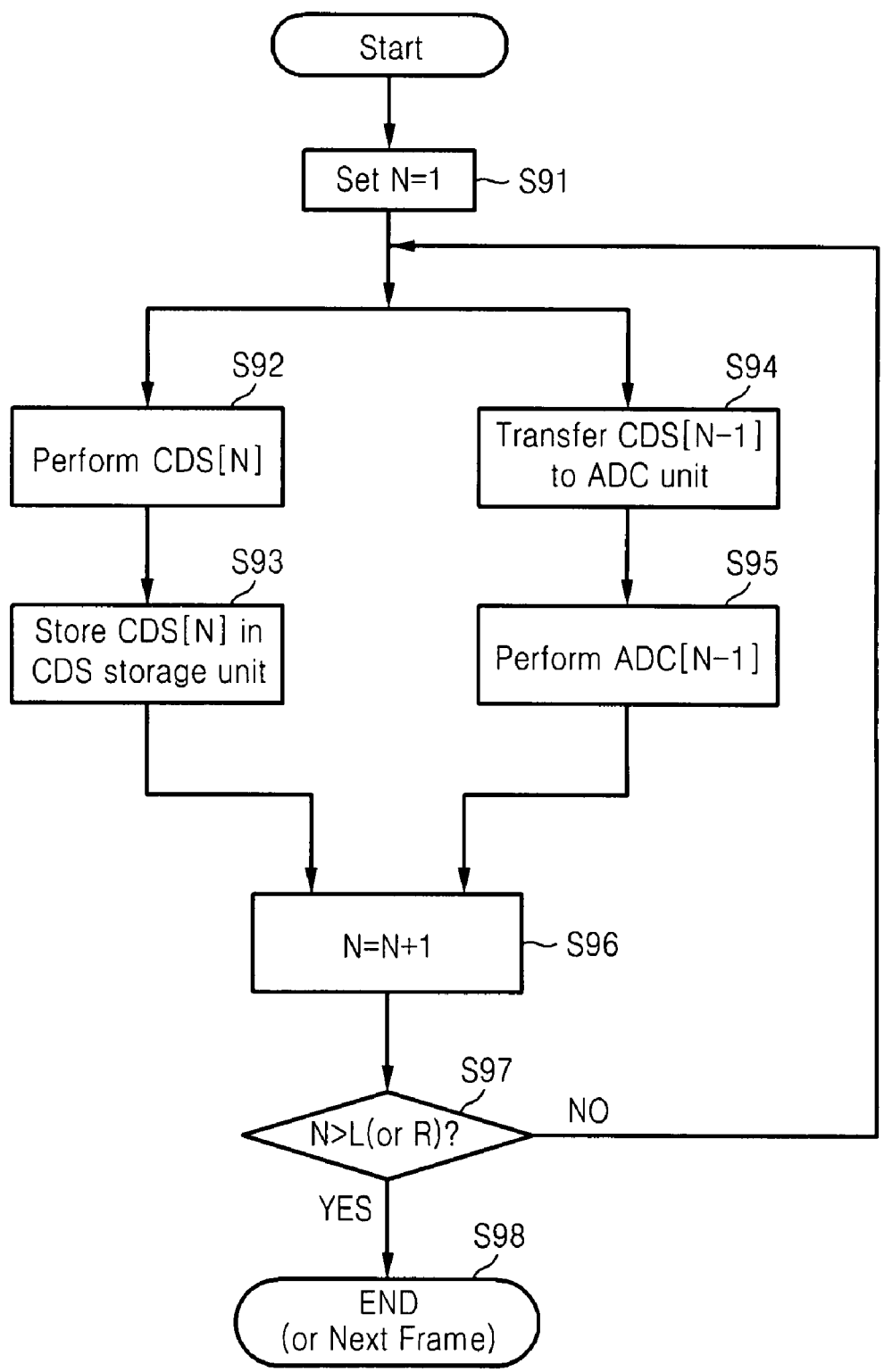
FIG. 9 is a flowchart of steps during operation of the unit CDS block of FIG. 5 for performing CDS and ADC concurrently in the image sensor, according to an embodiment of the present invention.

Operation of the example unit CDS block 30 of FIG. 5 within the CMOS image sensor 100 is now described with references to FIGS. 6A, 6B, 6C, 6D, 7, and 9. FIGS. 6A, 6B, 6C, and 6D show example configurations of the switches S1, S2, S3, S4, S5, and S6 in FIG. 5 for performing CDS and ADC concurrently for multiple lines of the CMOS image sensor 100. FIG. 7 is a timing diagram of signals during operation of the unit CDS block of FIG. 5 according to FIGS. 6A, 6B, 6C, and 6D. FIG. 9 is a flowchart of steps during operation of the unit CDS block of FIG. 5 according to FIGS. 6A, 6B, 6C, 6D, and 7.

For an example description, assume that an analog CDS signal generated for a first pixel connected to a prior (N−1)-th line of the image sensor 100 has already been stored in the second storage capacitor C3.

Referring to FIGS. 6A, 7, and 9, initially for sampling of a reset signal $V_{reset}$ from a second pixel coupled to an N-th line of the CMOS sensor 100, the first switch S1 is closed in response to the activated control signal SS1 such that the reset signal $V_{reset}$ is stored in the sampling capacitor C1 for starting of the correlated double sampling (step S92 of FIG. 9). Meanwhile, the fourth switch S4 is also closed in response to the activated control signal SS4 such that the analog CDS signal for the first pixel of the (N−1)-th line as stored in the second storage capacitor C3 is transmitted to ADC unit 35 (step S94 of FIG. 9). Also, the ramp signal $V_{RAMP}$ from the reference signal generator 35b begins to ramp up such that the ADC unit 35 performs ADC on the analog CDS signal for the first pixel of the (N−1)-th line (step S95 of FIG. 9).

Referring to FIGS. 6B, 7, and 9, the image signal $V_{signal}$ from the second pixel coupled to the N-th line is generated at the sampling capacitor C1. The first switch S1 is opened in response to the deactivated first control signal SS1, and the second switch S2 is closed in response to the activated second control signal SS2. Accordingly, the CDS unit 31 completes CDS to generate the analog CDS signal of the pixel connect to the N-th line (step S92 of FIG. 9). Such an analog CDS signal is a difference between the reset signal $V_{reset}$ and the image signal $V_{signal}$ of FIGS. 6A and 6B.

The buffer 32 buffers the analog CDS signal for the pixel of the N-th line output from the CDS unit 31. Furthermore in FIG. 6B, the third switch S3 is closed in response to the activated control signal SS3 such that the analog CDS value for the pixel of the N-th line is stored in the first storage capacitor C2 (step S93 of FIG. 9). Thus in FIGS. 6A and 6B, the ADC for the analog CDS signal of the first pixel connected to the (N−1)-th line as stored in the second storage capacitor C3 is performed (steps S94 and S95 in FIG. 9) concurrently with the CDS for generating and storing the analog CDS signal of the second pixel connected to the N-th line (steps S92 and S93 of FIG. 9).

Such concurrent ADC and CDS is next performed for the pixels of the N-th line and a (N+1)-th line in FIGS. 6C and 6D. Referring to FIG. 6C and 7, a reset signal $V_{reset}$ from a third pixel connected to the (N+1)-th line of the image sensor is applied at the sampling capacitor C1. At this time, the first switch S1 is closed in response to the activated control signal SS1 such that the reset signal $V_{reset}$ is stored in the sampling capacitor C1.

Meanwhile in FIG. 6C, the sixth switch S6 is also closed in response to the activated control signal SS6 such that the analog CDS signal of the pixel connected to the N-th line as stored in the first storage capacitor C2 is transmitted to the ADC unit 35. Accordingly, the ADC unit 35 performs ADC on such an analog CDS signal.

Subsequently referring to FIGS. 6D and 7, the image signal $V_{signal}$ from the third pixel connected to the (N+1)-th line is generated at the sampling capacitor C1. At this time, the first switch S1 is opened in response to the deactivated control signal SS1, and the second switch S2 is closed in response to the activated control signal SS2. Accordingly, the CDS unit 31 completes CDS to generate the analog CDS signal for the third pixel connect to the (N+1)-th line.

Furthermore in FIG. 6D, the fifth switch S5 is closed in response to the activated control signal SS5 such that the analog CDS value for the pixel of the (N+1)-th line is stored in the second storage capacitor C3. Thus in FIGS. 6C and 6D, the ADC for the analog CDS signal for the second pixel connected to the N-th line as stored in the first storage capacitor C2 is performed concurrently in parallel with the CDS for generating and storing the analog CDS signal of the third pixel connected to the (N+1)-th line.

In FIGS. 6A, 6B, 6C, and 6D, the switches S3, S4, S5, and S6 form a transmission control circuit 34 controlled by the timing controller 80 of FIG. 8. When the CDS array 22 includes a respective unit CDS block 30 for each column of pixels, the ADC may be performed for all columns of pixels in a previous line concurrently as the CDS is performed for generating analog CDS signals for all columns of pixels in a current line.

FIG. 9 shows a flow-chart for performing CDS and ADC concurrently in parallel in the unit CDS block 30 included in the CMOS image sensor of FIG. 3A. A variable N is initialized to 1 (step S91). Then, the ADC is performed on the analog CDS signal stored for the pixel connected to the (N−1)-th row (steps S94 and S95 in FIG. 9) concurrently in parallel as the CDS is performed for generating and storing the analog CDS signal for the pixel connected to the N-th row (steps S92 and S93 in FIG. 9).

Thereafter, the variable N is updated (step S96 of FIG. 9), and steps S92, S93, S94, S95, and S96 are repeated for the next set of two rows as indicated by the updated N unless N indicates that the last row has already been processed (step S97 in FIG. 9). If the last row has already been processed (N>L in step S97 of FIG. 9), the flowchart of FIG. 9 ends (step S98 of FIG. 9) as all the rows in the pixel array 20 have been processed. Alternatively, if the flow-chart of FIG. 9 is for processing of image frames, when the last row of a current frame has been processed (N>R in step S97 in FIG. 9), the flow-chart of FIG. 9 updates to the next frame (step S98 of FIG. 9), and the flow-chart of FIG. 9 may be repeated for the next frame.

Note that in the example of FIGS. 5, 6A, 6B, 6C, and 6D, the analog CDS signal of the current line N is stored in a storage unit different from another storage unit having the analog CDS signal of the previous line (N−1) stored thereon. When two storage units C2 and C3 for example are used, the analog CDS signals are alternately stored in the two storage units.

However, the present invention may be practiced with more numerous storage units. When the CDS storage unit 33 includes three or more storage units, e.g., C2, C3, . . . , and CN (where N is a natural number greater than 3), analog CDS signals of different lines may be sequentially stored in the storage units cyclically in order such as in C2, then C3, and so on to CN, and then in C2 again, then C3, and so on to CN. In this case, the number of times that analog CDS signals are stored in each storage unit is decreased as the number of storage units is increased.

In this manner, because the ADC and the CDS are performed concurrently with time overlap, the scan time "1H Time" of the unit CDS block 30 is significantly reduced for enhanced speed operation for high frame rate of the CMOS image sensor 100. In addition, such reduction of the scan time "1H Time" may be without reduction of an absolute time for the CDS, thereby preventing signal characteristics from being degraded.

While the present invention has been shown and described with reference to exemplary embodiments thereof, it will be understood by those of ordinary skill in the art that various changes in form and detail may be made herein without departing from the spirit and scope of the present invention, as defined by the following claims. Thus, although the unit CDS block 30 has been described for use within a CMOS image sensor, the unit CDS block 30 performing CDS and ADC concurrently may also be applied in other types of devices and systems having ADC with CDS.

The present invention is limited only as defined in the following claims and equivalents thereof.

What is claimed is:

1. An apparatus for signal processing, comprising:
   a CDS (correlated double sampling) unit for generating a first CDS signal from a first set of input signals generated at a predetermined node; and
   a conversion unit for converting a second CDS signal into a respective converted signal concurrently as the CDS unit generates the fist CDS signal, the second CDS signal being determined from a second set of input signals generated at the predetermined node,
   wherein a first time period for generating the first CDS signal by correlated double sampling overlaps a second time period for generating the respective converted signal of the second CDS signal by signal conversion.

2. The apparatus of claim 1, further comprising:
a CDS storage unit for storing the second CDS signal that was generated by the CDS unit before the CDS unit generates the first CDS signal; and
a transmission control unit including switches for transmitting the second CDS signal from the CDS storage unit to the conversion unit concurrently as the CDS unit generates the first CDS signal.

3. The apparatus of claim 2, wherein the transmission control unit transmits the second CDS signal from the CDS storage unit to the conversion unit concurrently as the first CDS signal is stored into the CDS storage unit.

4. The apparatus of claim 2, wherein the conversion unit further includes:
a comparing and digitizing unit that receives an analog CDS signal from the transmission control unit for digitizing a result of comparing a reference signal with the analog CDS signal, wherein the reference signal is one of a ramp signal or a DC (direct current) signal.

5. The apparatus of claim 2, wherein the CDS storage unit includes:
a first capacitor for storing the first CDS signal; and
a second capacitor for storing the second CDS signal.

6. The apparatus of claim 1, wherein the CDS unit further includes:
a capacitor having a first node coupled to the predetermined node;
a first switch coupled between a second node of the capacitor and a ground node; and
a second switch coupled between the second node of the capacitor and an output node of the CDS unit;
wherein the first and second switches are controlled to generate the first CDS signal from the first set of input signals generated successively at the predetermined node and to generate the second CDS signal from the second set of input signals generated successively at the predetermined node.

7. The apparatus of claim 1, wherein the predetermined node is coupled to a plurality of pixels of an image sensor, and wherein the first CDS signal is for a first pixel of said pixels, and wherein the second CDS signal is for a second pixel of said pixels.

8. An image sensor comprising:
a pixel array; and
a CDS array of a plurality of unit CDS blocks, each being coupled to a respective line of pixels of the pixel array and each including:
a CDS (correlated double sampling) unit for generating a first CDS signal from a first set of input signals generated at the respective line by a first pixel of said pixels; and
a conversion unit for converting a second CDS signal into a respective converted signal concurrently as the CDS unit generates the fist CDS signal, the second CDS signal being determined from a second set of input signals generated at the respective line by a second pixel of said pixels,
wherein a first time period for generating the first CDS signal by correlated double sampling overlaps a second time period for generating the respective converted signal of the second CDS signal by signal conversion.

9. The image sensor of claim 8, wherein the first and second pixels are adjacently disposed along a same column of pixels in the pixel array.

10. The image sensor of claim 8, wherein each unit CDS block further includes:
a CDS storage unit for storing the second CDS signal that was generated by the CDS unit before the CDS unit generates the first CDS signal; and
a transmission control unit including switches for transmitting the second CDS signal from the CDS storage unit to the conversion unit concurrently as the CDS unit generates the first CDS signal and concurrently as the first CDS signal is stored into the CDS storage unit.

11. The image sensor of claim 10, wherein each unit CDS block further includes:
a comparing and digitizing unit that receives an analog CDS signal from the transmission control unit for digitizing a result of comparing a reference signal with the analog CDS signal, wherein the reference signal is one of a ramp signal or a DC (direct current) signal.

12. The image sensor of claim 10, wherein the CDS storage unit includes:
a first capacitor for storing the first CDS signal; and
a second capacitor for storing the second CDS signal.

13. The image sensor of claim 8, wherein each unit CDS block further includes:
a capacitor having a first node coupled to the predetermined node;
a first switch coupled between a second node of the capacitor and a ground node; and
a second switch coupled between the second node of the capacitor and an output node of the CDS unit;
wherein the first and second switches are controlled to generate the first CDS signal from the first set of input signals generated successively at the predetermined node and to generate the second CDS signal from the second set of input signals generated successively at the predetermined node.

14. A method of signal processing, comprising:
generating a first CDS signal from CDS (correlated double sampling) of a first set of input signals generated at a predetermined node; and
converting a second CDS signal into a respective converted signal concurrently with generation of the fist CDS signal, the second CDS signal being determined from a second set of input signals generated at the predetermined node,
wherein a first time period for generating the first CDS signal by correlated double sampling overlaps a second time period for generating the respective converted signal of the second CDS signal by signal conversion.

15. The method of claim 14, further comprising:
storing the second CDS signal that was generated before the first CDS signal is generated.

16. The method of claim 14, further comprising:
storing the first CDS signal after the first CDS signal is generated concurrently as the second CDS signal is being converted into the respective converted signal.

17. The method of claim 16, further comprising:
transmitting the second CDS signal from storage for conversion concurrently as the first CDS signal is being generated and stored.

18. The method of claim 14, wherein the first and second CDS signals are analog signals to be converted into respective digital signals.

19. The method of claim 14, further comprising:

comparing the second CDS signal to a reference signal that is one of a ramp signal or a DC (direct current) signal; and digitizing a result of comparing the second CDS signal to the reference signal.

20. The method of claim 14, wherein the predetermined node is coupled to a plurality of pixels of an image sensor, and wherein the first CDS signal is for a first pixel of said pixels, and wherein the second CDS signal is for a second pixel of said pixels.

* * * * *